(12) United States Patent
Chen et al.

(10) Patent No.: US 7,916,494 B1
(45) Date of Patent: Mar. 29, 2011

(54) PRINTED CIRCUIT BOARD

(75) Inventors: Yung-Chieh Chen, Tu-Cheng (TW);
Cheng-Hsien Lee, Tu-Cheng (TW);
Shou-Kuo Hsu, Tu-Cheng (TW);
Shen-Chun Li, Tu-Cheng (TW);
Hsien-Chuan Liang, Tu-Cheng (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/633,655

(22) Filed: Dec. 8, 2009

(30) Foreign Application Priority Data

Nov. 13, 2009 (CN) .......................... 2009 1 0309670

(51) Int. Cl.
*H05K 7/00* (2006.01)
(52) U.S. Cl. ........ 361/760; 361/763; 361/765; 361/767; 174/259; 174/260; 174/261
(58) Field of Classification Search .................. 361/760, 361/763, 765, 767; 174/259–264; 333/1, 333/24, 324
See application file for complete search history.

(56) References Cited

U.S. PATENT DOCUMENTS

| 6,449,166 | B1 * | 9/2002 | Sly et al. ........................ 361/760 |
| 6,530,790 | B1 * | 3/2003 | McNamara et al. .......... 439/108 |

* cited by examiner

*Primary Examiner* — Tuan T Dinh
*Assistant Examiner* — Andargie M Aychillhum
(74) *Attorney, Agent, or Firm* — Zhigang Ma

(57) ABSTRACT

A printed circuit board includes a high-speed differential signal control chip, first to fourth coupling capacitor pads, first and second connector pads, first and second inductor pads, a number of transmission lines, a power pin, two sharing pads, and two selection pads. Two coupling capacitors can selectively connect the first and second coupling capacitor pads and the two sharing pads or between the third and fourth coupling capacitor pads and the two sharing pads, respectively. Two inductors can connect the first and second inductor pads and the two selection pads respectively, and the first and second inductor pads and the two selection pads can be void.

3 Claims, 6 Drawing Sheets

PRINTED CIRCUIT BOARD

BACKGROUND

1. Technical Field

The present disclosure relates to printed circuit boards (PCBs) and, particularly, to a PCB selectively supporting two different connectors and selectively connected to two inductors.

2. Description of Related Art

A computer motherboard includes hard disk drive (HDD) connectors to install HDDs, such as SAS (serial attached SCSI) HDDs and SATA (serial ATA) HDDs. While SAS and SATA HDDs can use the same peripheral component interconnection (PCI) chip for transmitting data, the motherboard normally only supports connectors of one type, meaning that layout of the motherboard must be changed when the HDD type is changed, increasing the cost for producing motherboard.

DETAILED DESCRIPTION

Figure 1:
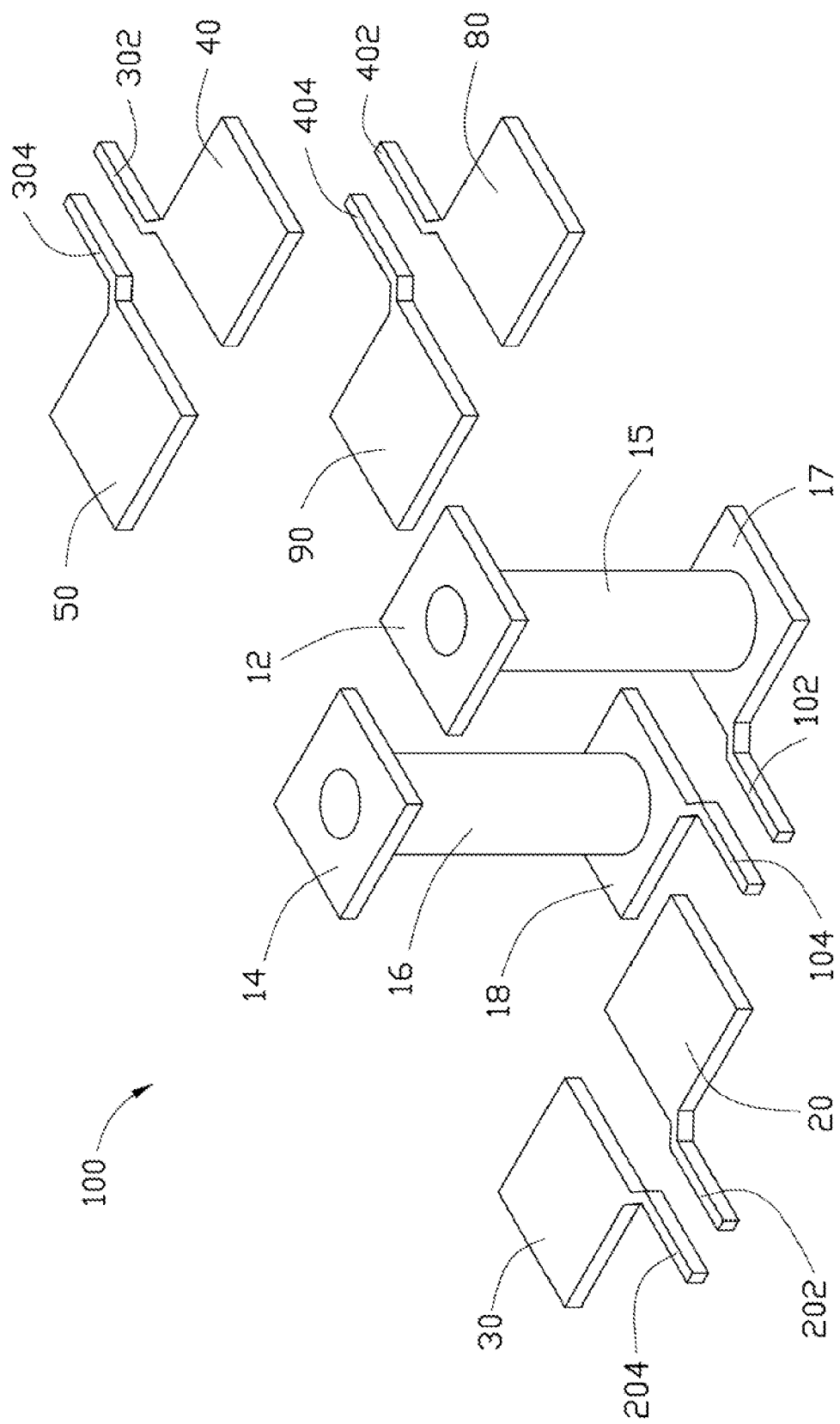
FIG. 1 is a schematic, isometric view of an exemplary embodiment of printed circuit board (PCB).
Figure 2:
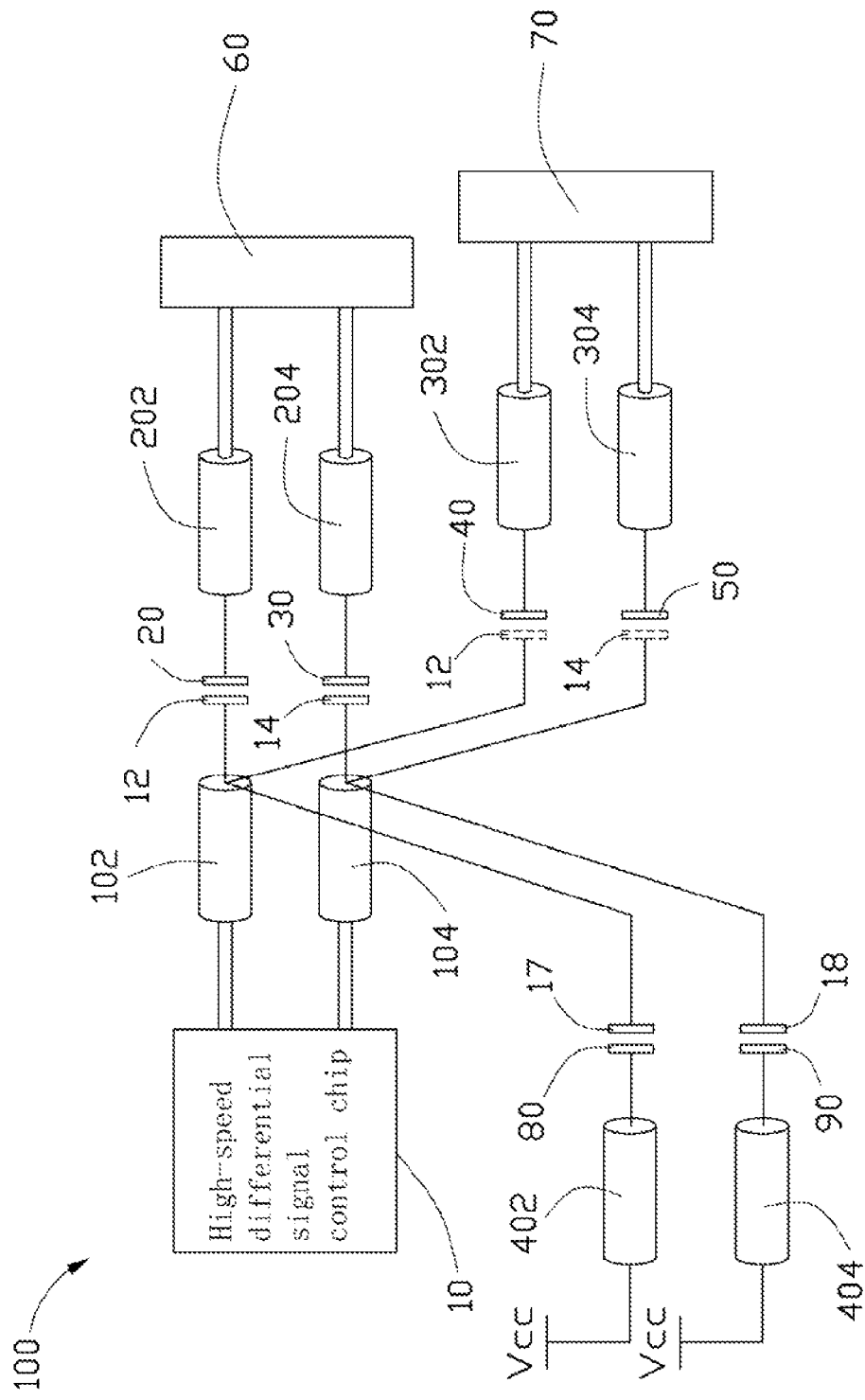
FIG. 2 is a circuit diagram of the PCB of FIG. 1.

Referring to FIGS. 1 and 2, an exemplary embodiment of a printed circuit board (PCB) 100 includes a high-speed differential signal control chip 10, first to fourth coupling capacitor pads 20-50, first and second connector pads 60 and 70, first and second inductor pads 80 and 90, eight transmission lines 102, 104, 202, 204, 302, 304, 402, and 404, and a power pin Vcc. In one embodiment, the control chip 10, the transmission lines 102, 104, 402, and 404, the first and second inductor pads 80 and 90, and the power pin Vcc are arranged a first layer of the PCB 100, and the transmission lines 202, 204, 302, and 304, the first to fourth coupling capacitor pads 20-50, and the first and second connector pads 60 and 70 are arranged on a second layer of the PCB 100 above the first layer. The first and second connector pads 60 and 70 are for different types of connectors.

First terminals of the transmission lines 202 and 204 are connected to two input terminals of the first connector pad 60. Second terminals of the transmission lines 202 and 204 are connected to the first and second coupling capacitor pads 20 and 30, respectively. First terminals of the transmission lines 302 and 304 are connected to two input terminals of the second connector pad 70. Second terminals of the transmission lines 302 and 304 are connected to the third and fourth coupling capacitor pads 40 and 50, respectively. First terminals of the transmission lines 402 and 404 are connected to the power pin Vcc which is connected to a power source, such as 1.2V (not shown). Second terminals of the transmission lines 402 and 404 are connected to the first and second inductor pads 80 and 90, respectively.

The PCB 100 further includes a sharing pad 12 arranged on the second layer and between the first coupling capacitor pad 20 and the third coupling capacitor pad 40, and a sharing pad 14 arranged on the second layer and between the second coupling capacitor pad 30 and the fourth coupling capacitor pad 50. The PCB 100 further includes two selection pads 17 and 18 arranged on the first layer and connected to the two sharing pads 12 and 14 through two vias 15 and 16, respectively. First terminals of the transmission lines 102 and 104 are connected to two output terminals of the control chip 10. Second terminals of the transmission lines 102 and 104 are connected to the two selection pads 17 and 18, respectively.

Figure 3:
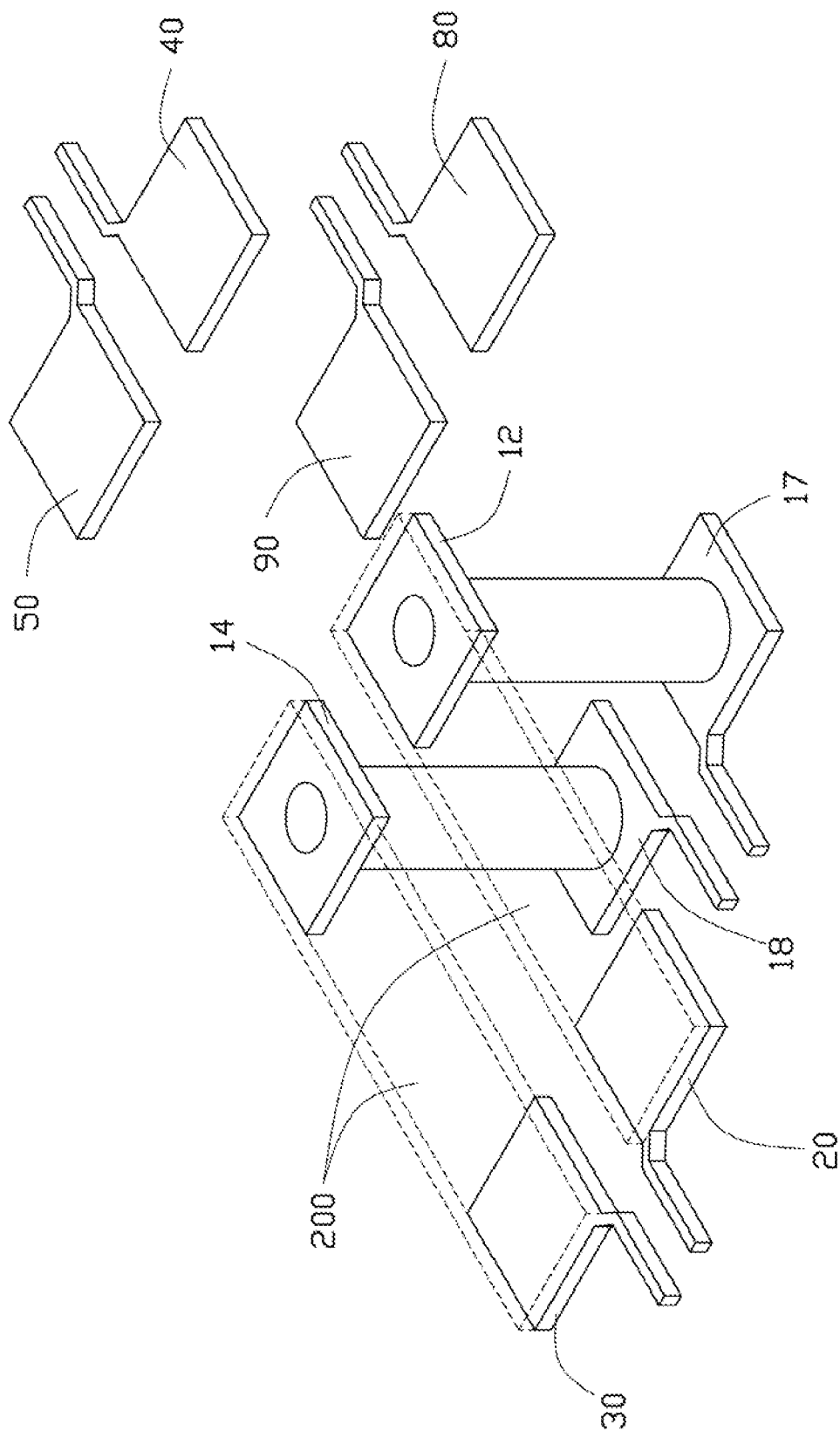
FIG. 3 is a schematic, isometric view of the PCB of FIG. 1, together with two first coupling capacitors.

Referring to FIG. 3, when a first type of connector (not shown) is installed on the first connector pad 60, and the control chip 10 has no need to improve transmission quality, the first and second inductor pads 80 and 90, the third and fourth coupling capacitor pads 40 and 50, and the selection pads 17 and 18 are void. Two first coupling capacitors 200, such as alternating current (AC) coupling capacitors, connect the first coupling capacitor pad 20 and the sharing pad 12 and between the second coupling capacitor pad 30 and the sharing pad 14, respectively. Therefore, high-speed differential signals output by control chip 10 are transmitted to the first type of connector through the transmission lines 102 and 104, the selection pads 17 and 18, the vias 15 and 16, the sharing pads 12 and 14, the first coupling capacitors 200, the first and second coupling capacitor pads 20 and 30, and the transmission lines 202 and 204 in order.

Figure 4:
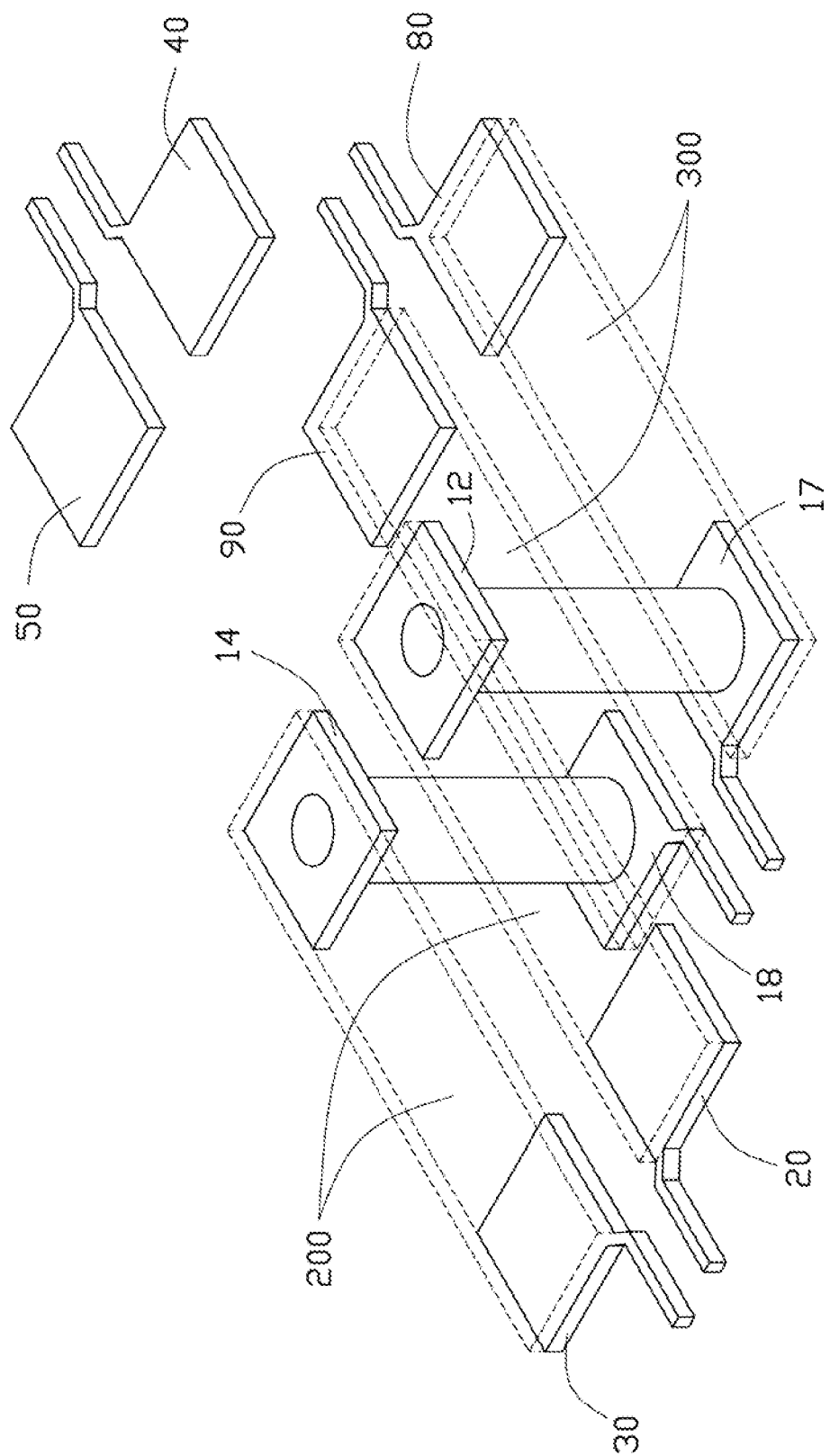
FIG. 4 is a schematic, isometric view of the PCB of FIG. 1, together with two first coupling capacitors and two inductors.

Referring to FIG. 4, when the first connector is installed on the first connector pad 60 and the control chip 10 has a need to improve transmission quality, the third and fourth coupling capacitor pads 40 and 50 are void. Two first coupling capacitors 200 connect the first capacitor pad 20 and the sharing pad 12 and the second coupling capacitor pad 30 and the sharing pad 14, respectively. Two inductors 300, such as ferrite beads, connect the first inductor pad 80 and the selection pad 17 and between the second inductor pad 90 and the selection pad 18, respectively. Thus, high-speed differential signals output by the control chip 10 are transmitted to the first type of connector through the transmission lines 102 and 104, the selection pads 17 and 18, the vias 15 and 16, the sharing pads 12 and 14, the first coupling capacitors 200, the first and second coupling capacitor pads 20 and 30, and the transmission lines 202 and 204 in order. Moreover, because the control chip 10 is connected to the power source through the transmission lines 102 and 104, the selection pads 17 and 18, the inductors 300, the first and second inductor pads 80 and 90, the transmission lines 402 and 404, and the power pin Vcc in order, the transmission quality is improved.

Figure 5:
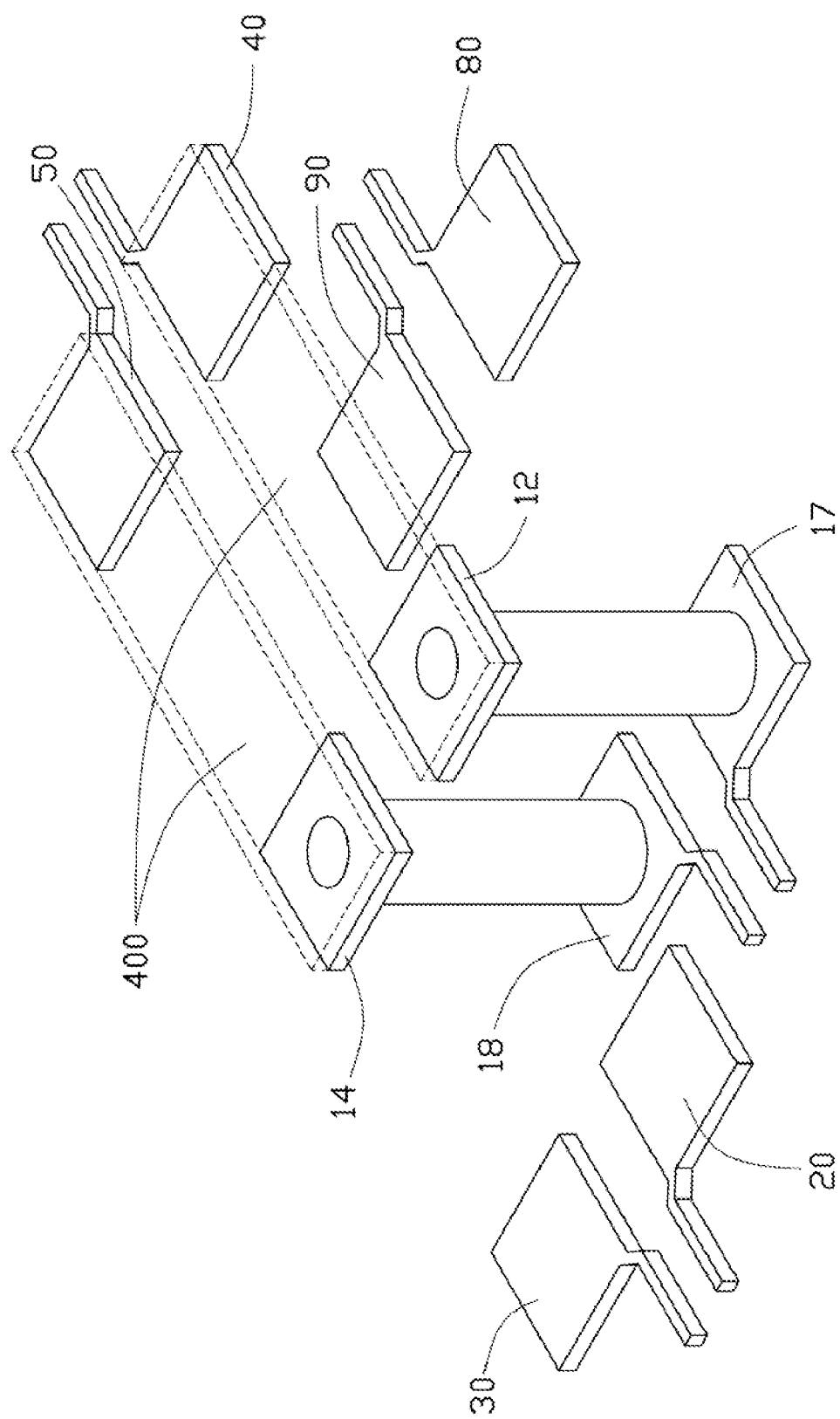
FIG. 5 is a schematic, isometric view of the PCB of FIG. 1, together with two second coupling capacitors.

Referring to FIG. 5, when a second type of connector (not shown) is installed on the second connector pad 70, and the control chip 10 has no need to improve transmission quality, the first and second inductor pads 80 and 90, the first and second coupling capacitor pads 20 and 30, and the selection pads 17 and 18 are void. Two second coupling capacitors 400 connect the third capacitor pad 40 and the sharing pad 12 and between the fourth capacitor pad 50 and the sharing pad 14. Therefore, high-speed differential signals output by control chip 10 are transmitted to the second type of connector through the transmission lines 102 and 104, the selection pads 17 and 18, the vias 15 and 16, the sharing pads 12 and 14, the second coupling capacitors 400, the third and fourth coupling capacitor pads 40 and 50, and the transmission lines 302 and 304 in order.

Figure 6:
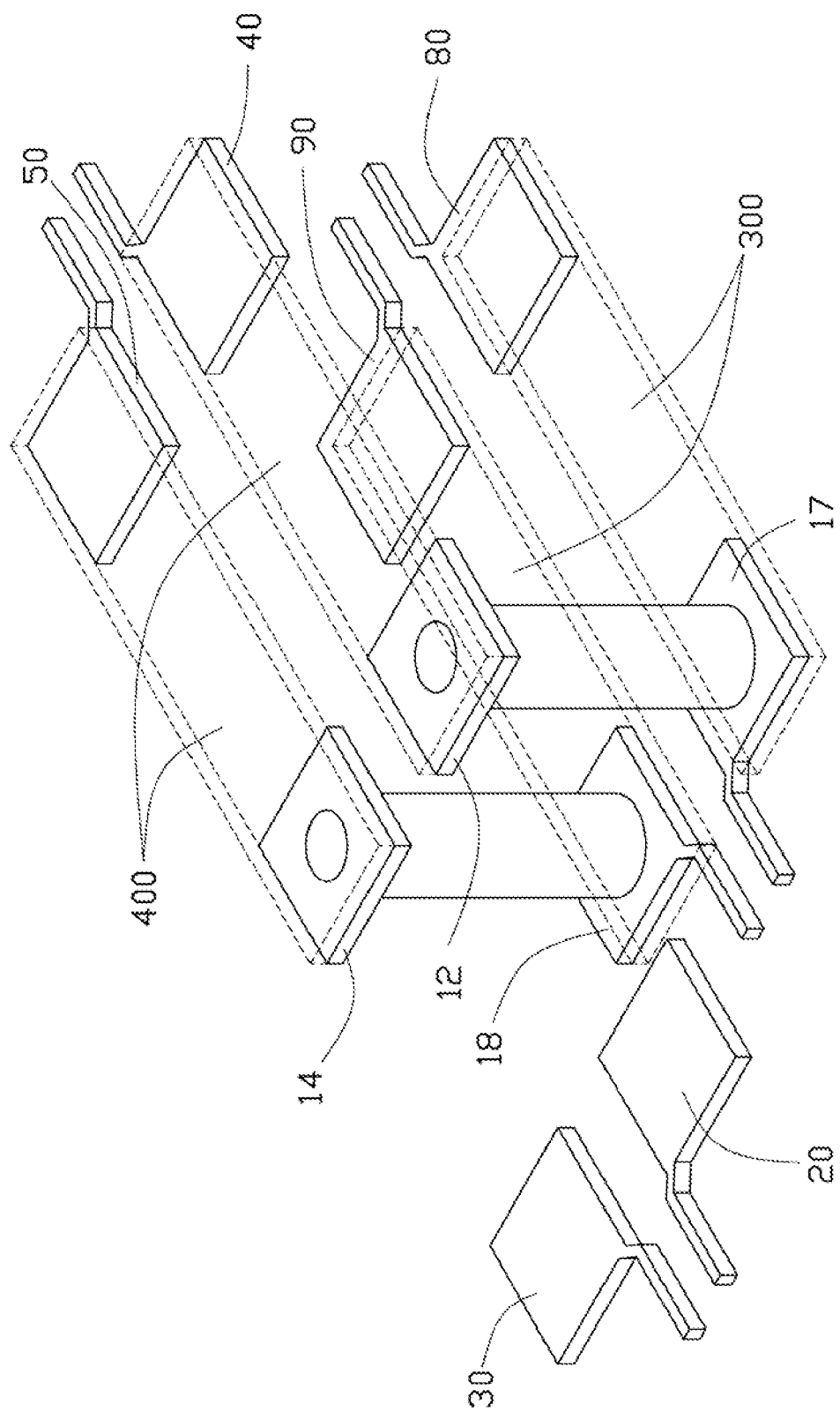
FIG. 6 is a schematic, isometric view of the PCB of FIG. 1, together with two second coupling capacitors and two inductors.

Referring to FIG. 6, when the second type of connector is installed on the second connector pad 70 and the control chip 10 has a need to improve transmission quality, the first and second coupling capacitor pads 20 and 30 are void. Two second coupling capacitors 400 connect the third coupling capacitor pad 40 and the sharing pad 12 and between the fourth coupling capacitor pad 50 and the sharing pad 14, respectively. Two inductors 300 connect the first inductor pad 80 and the selection pad 17 and between the second inductor pad 90 and the selection pad 18. Thus, high-speed differential signals output by control chip 10 are transmitted to the second connector through the transmission lines 102 and 104, the selection pads 17 and 18, the vias 15 and 16, the sharing pads 12 and 14, the second coupling capacitors 400, the third and fourth coupling capacitor pads 40 and 50, and the transmission lines 302 and 304 in order. Moreover, because the control chip 10 is connected to the power source through the transmission lines 102 and 104, the selection pads 17 and 18, the inductors 300, the first and second inductor pads 80 and 90, the transmission lines 402 and 404, and the power pin Vcc in order, the transmission quality is improved.

Therefore, the PCB 100 is capable of flexibly supporting different types of connectors, and selectively improving transmission quality according to requirements, with cost for designing and producing the PCB low.

It is to be understood, however, that even though numerous characteristics and advantages of the embodiments have been set forth in the foregoing description, together with details of the structure and function of the embodiments, the disclosure is illustrative only, and changes may be made in details, especially in matters of shape, size, and arrangement of parts within the principles of the embodiments to the full extent indicated by the broad general meaning of the terms in which the appended claims are expressed.

What is claimed is:
1. A printed circuit board (PCB) comprising:
a high-speed differential signal control chip;
a first to a fourth coupling capacitor pads;
a first and a second connector pads;
a first and a second inductor pads;
two first transmission lines, two second transmission lines, two third transmission lines, and two fourth transmission lines;
a power pin; and
two sharing pads arranged on the same layer together with the second and third transmission lines, the first to fourth coupling capacitor pads, and the first and second connector pads, wherein two first terminals of the two first transmission lines are connected to two output terminals of the high-speed differential signal control chip respectively, two second terminals of the two first transmission lines are connected to the two selection pads respectively, two first terminals of the two fourth transmission lines are connected to the power pin respectively, two second terminals of the two fourth transmission lines are connected to the two inductor pads respectively; and
two selection pads connected to the two sharing pads through two vias, respectively, and arranged on the same layer together with the high-speed differential signal control chip, the first and fourth transmission lines, the first and second inductor pads, and the power pin, wherein two first terminals of the two second transmission lines are connected to the first connector pads respectively, two second terminals of the two second transmission lines are connected to the first and second coupling capacitor pads respectively, two first terminals of the two third transmission lines are connected to the second connector pads respectively, two second terminals of the third transmitting lines are connected to the third and fourth coupling capacitor pads respectively;
wherein a coupling capacitor is operable to selectively connect each of the first and second coupling capacitor pads and a corresponding one of the two sharing pads, or connect each of the third and fourth coupling capacitor pads and a corresponding one of the two sharing pads; and
wherein an inductor is operable to connect each of the first and second inductor pads and a corresponding one of the two selection pads, and the first and second inductor pads and the two selection pads are operable to be void.
2. The PCB of claim 1, wherein the two inductors are ferrite beads.
3. The PCB of claim 1, wherein the two coupling capacitors are alternating current coupling capacitors.

* * * * *